(12) United States Patent
Pitts

(10) Patent No.: US 7,800,409 B2
(45) Date of Patent: Sep. 21, 2010

(54) LOGIC BLOCK, A MULTI-TRACK STANDARD CELL LIBRARY, A METHOD OF DESIGNING A LOGIC BLOCK AND AN ASIC EMPLOYING THE LOGIC BLOCK

(75) Inventor: Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 186 days.

(21) Appl. No.: 11/830,696

(22) Filed: Jul. 30, 2007

(65) Prior Publication Data

US 2009/0033368 A1 Feb. 5, 2009

(51) Int. Cl.
*H03K 19/00* (2006.01)
(52) U.S. Cl. .......................................... 326/101; 326/37
(58) Field of Classification Search ......... 326/101–103, 326/37
See application file for complete search history.

(56) References Cited

U.S. PATENT DOCUMENTS 6,849,906 B2 * 2/2005 Maeno et al. ................ 257/390
7,302,660 B2 * 11/2007 Shimamura .................... 716/8

* cited by examiner

*Primary Examiner*—Don P Le
(74) *Attorney, Agent, or Firm*—Dawn V. Stephens; Wade James Brady, III; Frederick J. Telecky, Jr.

(57) ABSTRACT

A logic block, a cell library, a method of designing a logic block and an ASIC including the logic block. The invention provides a logic block including rows of standard cells having different track heights. In one embodiment, the invention provides a logic block including: (1) a first row of standard cells having a first track height and (2) a second row of standard cells adjacent to the first row and having a second track height that differs from the first track height.

18 Claims, 5 Drawing Sheets

LOGIC BLOCK, A MULTI-TRACK STANDARD CELL LIBRARY, A METHOD OF DESIGNING A LOGIC BLOCK AND AN ASIC EMPLOYING THE LOGIC BLOCK

TECHNICAL FIELD OF THE INVENTION

The invention is directed, in general, to cell-based design circuits and, more specifically, to cell libraries having standard cells with different cell heights and logic blocks having rows of multiple track heights with at least a single row employing the standard cells with different cell heights.

BACKGROUND OF THE INVENTION

An Application Specific Integrated Circuit (ASIC) is one example of a cell-based circuit. An ASIC includes at least one logic block customized for a particular use. A logic block is an arrangement of "cells" placed in a routing grid of vertical and horizontal "tracks." Tracks are conductive structures, such as metallic structures, that provide routing over each of the cells. Two tracks, typically horizontal tracks, are used to provide power ($V_{DD}$) and ground ($V_{SS}$) to each of the cells. One track is usually reserved for power and thus is often called the $V_{DD}$ track; another track is usually reserved for ground and thus is often called the $V_{SS}$ track. The $V_{DD}$ track and the $V_{SS}$ track are frequently referred to jointly as the "power rails."

The cells in a logic block are arranged in rows defined by the horizontal tracks. The height of each row, referred to as "track height," is based on the number of horizontal tracks encompassing the cells on the row. Thus, a row having a track height of ten, i.e., a ten-track row, consists of ten horizontal tracks.

When designing and fabricating ASICs, cells are typically standard cells selected from cell libraries and placed in the logic blocks to expedite the process. The standard cells are predefined structures that represent design components used in a circuit. Each standard cell includes a group of transistors and interconnects that provide predefined functions such as logical or storage functions. Cell libraries include numerous standard cells that can be selected and combined to form a particular circuit design.

Usually, cells of a particular standard cell library are selected and laid out relative to the routing grid, which defines the horizontal and vertical tracks, to form a logic block. The "height" of a cell is determined by the number of horizontal tracks extending between the uppermost and lowermost points of the cell. The "width" of a cell is determined by the vertical tracks extending between the leftmost and rightmost points of the cell. In a conventional cell library, the standard cells usually have the same cell height. For example, a cell library would include multiple cells having a cell height of ten tracks, i.e., ten-track cells.

Tools are available to assist in using the cell libraries to automate the synthesis, placement and routing of the cells to form the logic blocks. Synthesis tools automatically select standard cells from a cell library to form an interconnected list (often called a "netlist") of cells to represent the required functionality of an ASIC or a portion of an ASIC. Following synthesis, a placement tool initiates the physical implementation of the logic blocks by automatically assigning locations of the standard cells on the netlist to a two-dimensional floor plan that forms the logic block. A routing tool then adds the power rails and signal connect lines for the standard cells placed in the logic block. A lay out tool is then used to construct a representation in three-dimensions of the logic block. The representation includes, for example, n-doped regions ("n-well") and p-doped regions ("p-well") of semiconductor substrate designated for the various standard cells.

As a result of modern tool capability and library construction techniques, logic blocks made up of standard cells allow complex circuits, such as ASICs, to be designed efficiently. Nevertheless, improvements in the design and fabrication of logic blocks would prove beneficial in the art.

SUMMARY OF THE INVENTION

To address the above-discussed deficiencies of the prior art, the invention provides a logic block, a cell library, a method of designing a logic block and an ASIC. The invention provides a logic block including rows of standard cells having different track heights. In one embodiment, the invention provides a logic block including: (1) a first row of standard cells having a first track height and (2) a second row of standard cells adjacent to the first row and having a second track height that differs from the first track height.

In another aspect, the invention provides a cell library. The cell library includes: (1) a first group of standard cells having a first cell height and (2) a second group of standard cells having a second cell height less than the first cell height, wherein each standard cell of the second group is designed to be placed in a logic block row having a track height substantially equivalent to the first cell height.

In yet another aspect, the invention provides a method of designing a logic block. The method includes arranging synthesized standard cells into rows of different track height.

Additionally, the invention provides in a different aspect an ASIC including a logic block. The logic block includes: (1) a row of standard cells having a first track height and including at least (1A) one first standard cell with a first cell height substantially equivalent to the first track height and (1B) at least one second standard cell with a second cell height less than the first cell height, wherein power rails for the first and the second standard cell are aligned when placed in the row.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
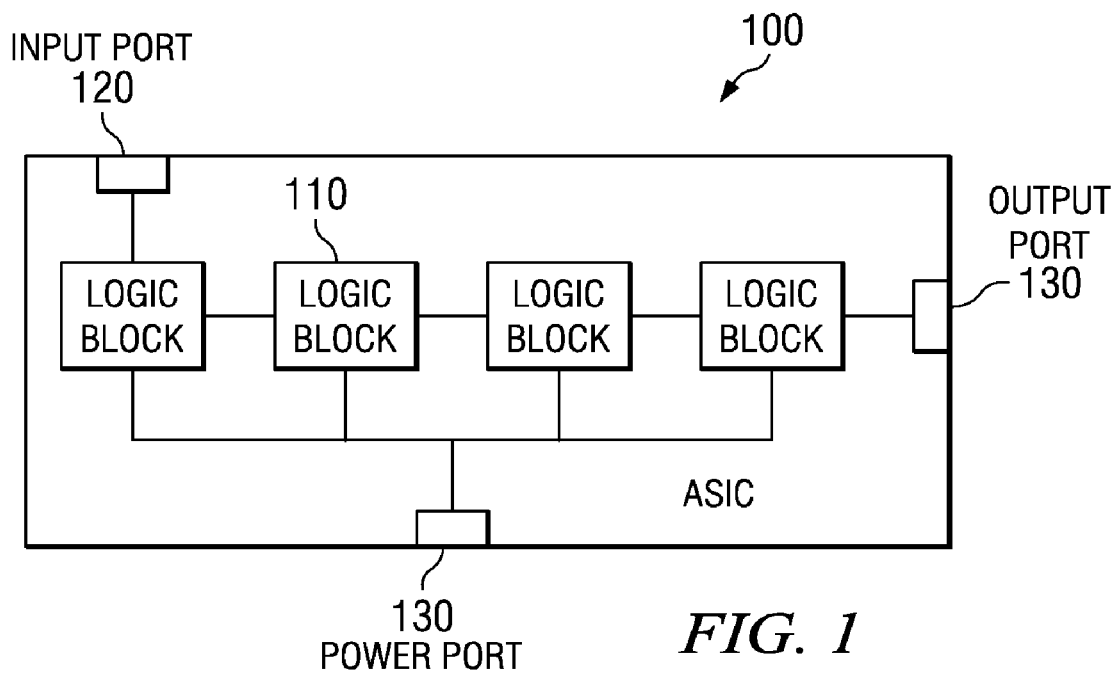
FIG. 1 illustrates a block diagram of an embodiment of an ASIC constructed according to the principles of the invention.

FIG. 1 illustrates a block diagram of an embodiment of an ASIC 100 constructed according to the principles of the invention. The ASIC 100 includes multiple logic blocks coupled together wherein one is designated 110. The ASIC 100 includes an input port 120, an output port 130 and a power port 140. The ASIC 100 may be part of a device that provides power to the ASIC via a battery through the power port 140. Additionally, input and output signals may traverse between the device and the input port 120 and output port 130. The ASIC 100 includes conventional conductive interfaces, as represented in FIG. 1, which couple the various elements together. The ASIC 100 may include additional components that are typically included in a conventional ASIC but are not illustrated or discussed.

The input port 120 and the output port 130 are configured to provide signal access to and from the ASIC 100 and each of the logic blocks. Both the input port 120 and the output port 130 are conventional pads typically included in a conventional ASIC. In FIG. 1, the input port 120 and the output port 130 are directly coupled to a single logic block via the conductive interfaces. Alternatively, the input port 120 and the output port 130 can be directly coupled to multiple of the logic blocks.

The power port 140 is configured to provide power $V_{DD}$ and ground $V_{SS}$ to the ASIC 100 and each of the logic blocks. The power port 140 couples to power rails of each logic block. The power port 140 is also a conventional port typically included in an ASIC.

The logic block 110 is constructed according to the principles of the invention. The logic block 110 includes multiple rows of cells selected from a cell library. The cell library includes a set of standard cells with various cell heights and compatible footprints that allow multiple cell heights on a single row having a fixed track height. Each of the standard cells in the cell library are designed and constructed to fit together in a row even though the cell heights of the standard cells differ. For example, in some embodiments the power rails of the multi-height standard cells are located at horizontal tracks that are common to each of the multi-height standard cells to insure alignment when placed in the row. Mixing the standard cells with different cell heights and compatible footprints permits improved performance, power, and area optimization in synthesized logic blocks. Routing flexibility is also preserved while minimizing base area loss.

Logic block 110 includes at least one row of standard cells having a first track height and including at least one standard cell with a cell height substantially equivalent to the track height and at least a second standard cell with a cell height less than the first track height. Substantially equivalent includes variations due to, for example, processing. Thus, substantially equivalent indicates that the cell height and the track height are designed to be equivalent but may not be exactly equivalent due to process variations. Accordingly, when used herein, equivalent means substantially equivalent.

The power rails for the first and the second standard cells are aligned when placed in the row. In one embodiment, the row includes another standard cell with a third cell height that also differs from the track height. The power rails for the third standard cell also align with the power rails of the first and the second standard cells when the third standard cell is placed in the row.

The logic block 110 may also include a row having a second track height. Additionally, the logic block 110 may include a third row having a third track height. In one embodiment, the first track height and the first cell height is ten, the second track height and the second cell height is eight, and the third track height and the third cell height is seven. The logic block 110 may be configured as illustrated and discussed below with respect to FIGS. 2-5. Additionally, the other non-designated logic blocks may also be constructed according to the lay out representations of FIGS. 2-5.

FIGS. 2-5 illustrate various layout diagrams representing embodiments of logic blocks, or at least a portion of logic blocks, constructed according to the principles of the invention. In each of the FIGS. 2-5, five rows of cells are illustrated. Each of the cells represented in FIGS. 2-5 is a standard cell selected from a cell library. One skilled in the art will understand that the logic blocks represented by FIGS. 2-5 may include additional rows and/or additional cells.

Portions of each logic block containing n-well areas are shaded, whereas portions containing p-well areas under each of the cells are not shaded. Areas of unusable base are also indicated. Certain areas of the base are rendered unusable to compensate for the different cell heights and, in some embodiments, for the necessary routing to connect the power rails in a row. "Unusable base" refers to semiconductor substrate of the ASIC wherein no components are placed because this area is small and has minimal if any feasible value.

Figure 2:
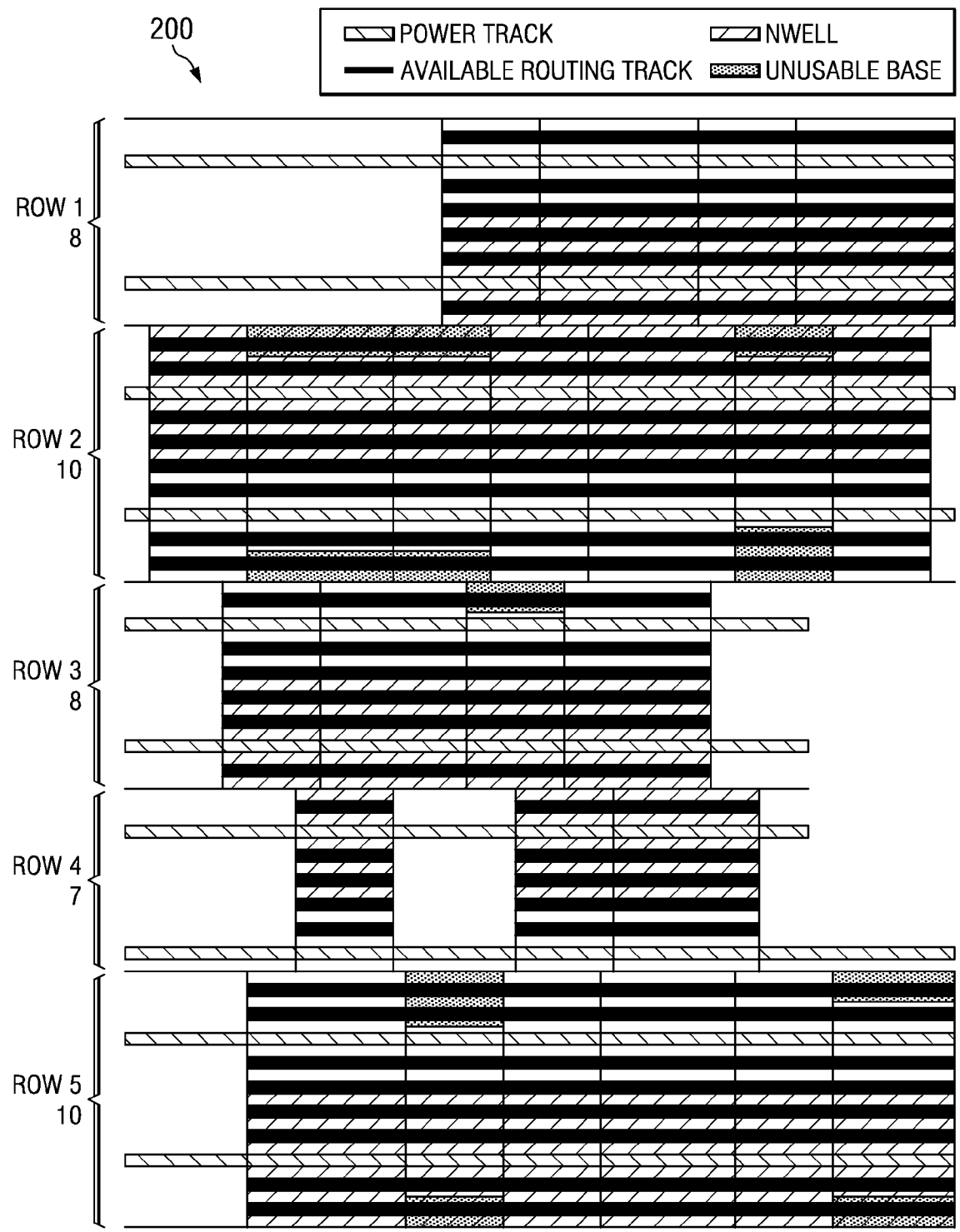
FIGS. 2, 3, 4 and 5 illustrate layout diagrams of embodiments of a logic block constructed according to the principles of the invention.

FIG. 2 illustrates a layout of an embodiment of a logic block, generally designated logic block 200. The logic block 200 includes five rows of varying track height. Rows 1 and 3 have a track height of eight, Rows 2 and 5 have a track height of 10 and Row 4 has a track height of seven. Each cell in Row 1 has a cell height, eight, that is equivalent to the track height of Row 1. In Row 4, each cell also has a cell height, seven, that is equivalent to Row 4's track height.

Rows 2, 3 and 5 include cells of different cell heights. Rows 2 and 5, both having a track height of ten, include at least one cell with a height of seven, eight and ten. Row 3 with a track height of eight, includes cells having a height of eight and a cell having a height of seven.

In each of the five rows, the power rails for each of the cells are in alignment. In other words, each cell is designed wherein the power rails are aligned and in pitch with the other horizontal tracks of the logic block 200. For example, in Row 1, the power track $V_{DD}$ is the second track from the top for each cell and the ground track $V_{SS}$ is the second track from the bottom. As such, the power rails for each of the cells are aligned when placed in Row 1. Additionally, the power rails for each of the cells are in pitch with the other tracks. The power rails for the cells of Row 4 are also aligned and in pitch. In Row 4, the power track $V_{DD}$ is the second track from the top for each cell and the power track $V_{SS}$ is the bottom track.

In Rows 2, 3 and 4, the power rails for each of the cells are also aligned and in pitch even though there are cells with different cell heights. For example, in Row 2, the two cells with a cell height of eight and the one cell with a cell height of seven have power rails that are aligned with the power rails of the cells with a cell height of ten. To insure alignment, area of the base adjacent the eight and seven cells is rendered unusable. With respect to the eight and seven cells, area above and below each cell is rendered unusable. This is also true in Row 5. In Row 3, however, only area above the seven cell is rendered unusable.

Figure 3:
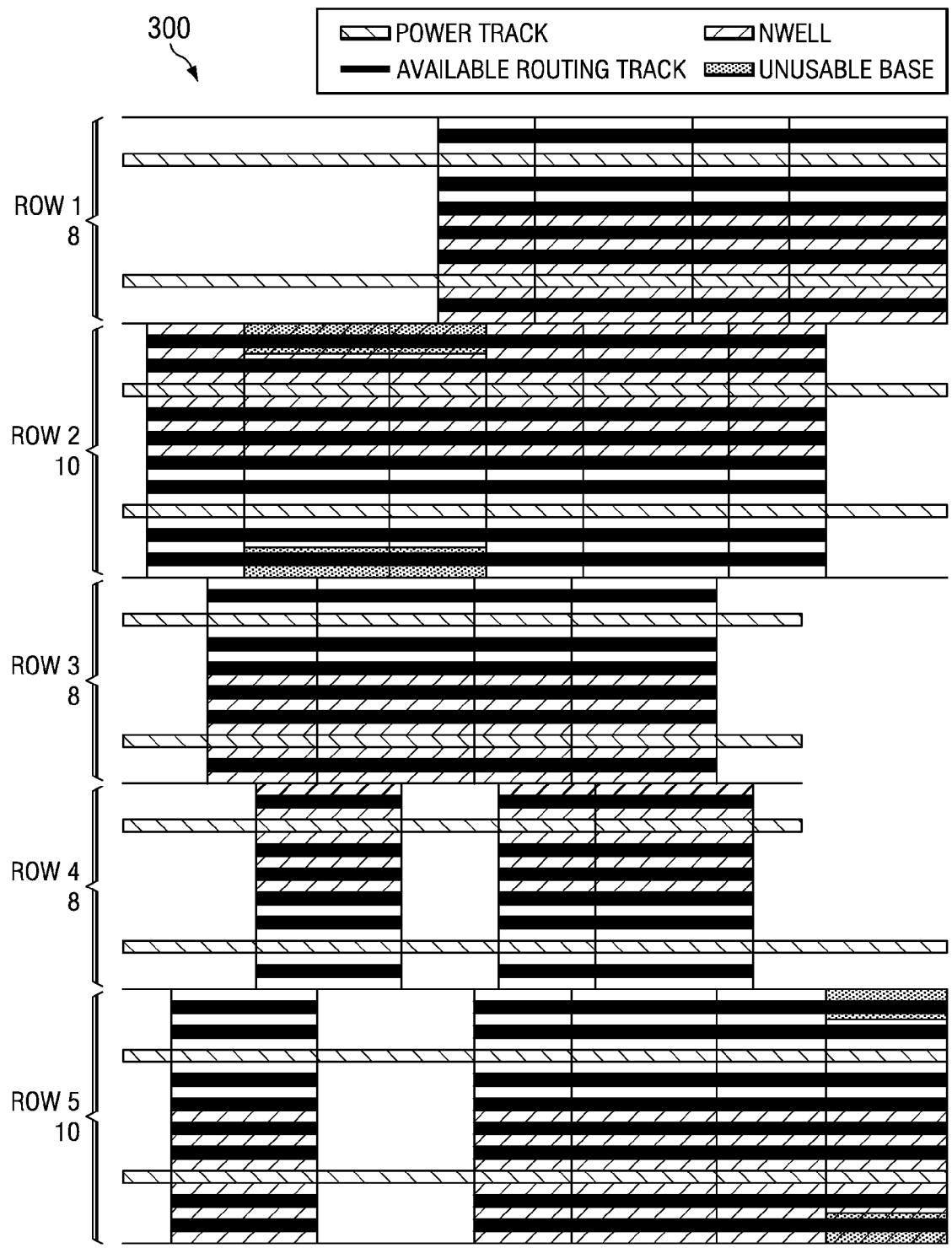

FIG. 3 illustrates a layout of an embodiment of a logic block, generally designated logic block 300. The logic block 300 includes five rows of two different track heights. Rows 1, 3 and 4 have a track height of eight and Rows 2 and 5 have a track height of 10. Each cell in Rows 1, 3 and 4 has a cell height of eight that is equivalent to the track height. Rows 2 and 5 include cells of different height. In addition to cells having a cell height of ten, Row 2 includes two cells having a cell height of eight; Row 5 includes one cell having a cell height of eight. In each of Rows 1-5, the power rails of each of the cells are in alignment.

Figure 4:
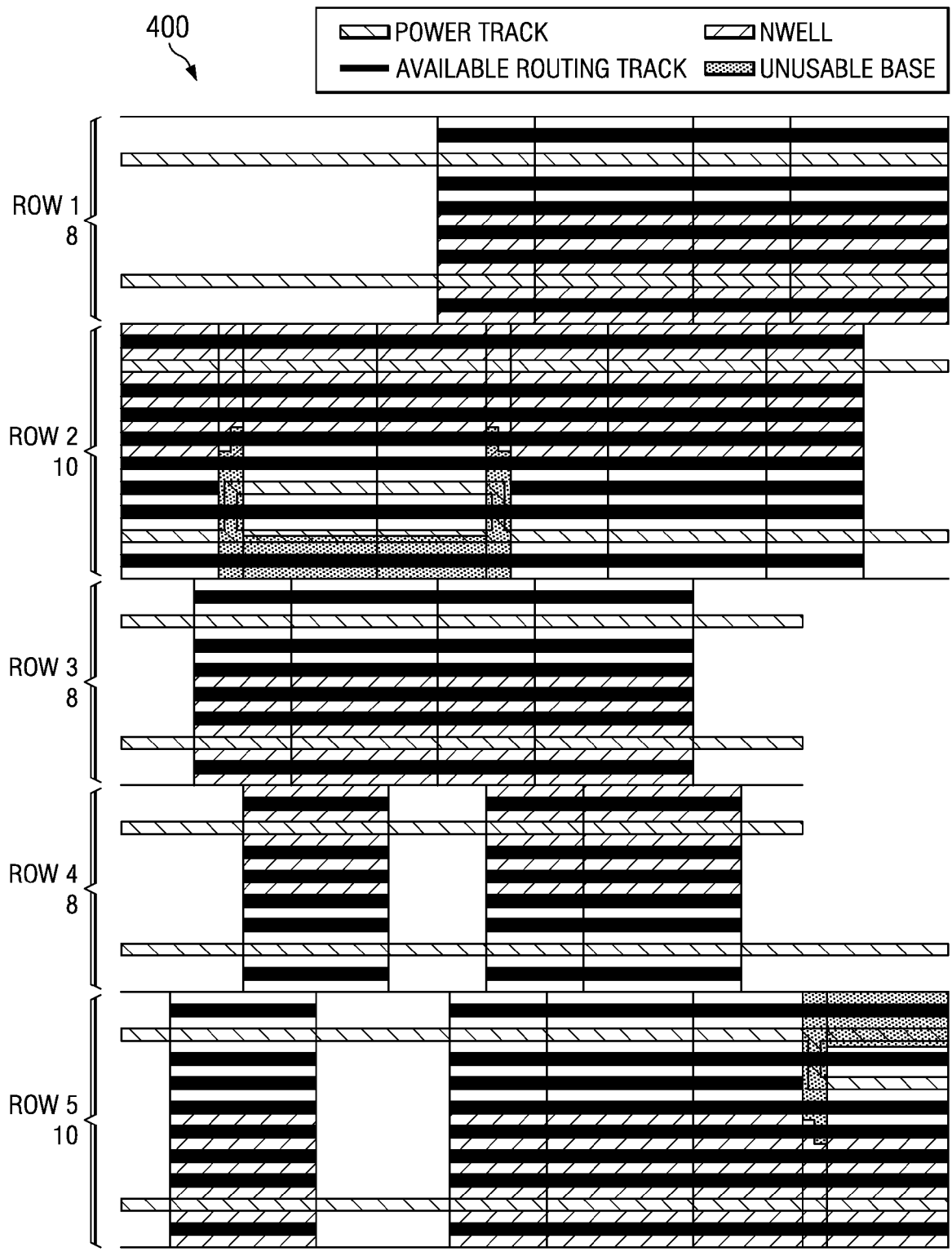
Figure 5:
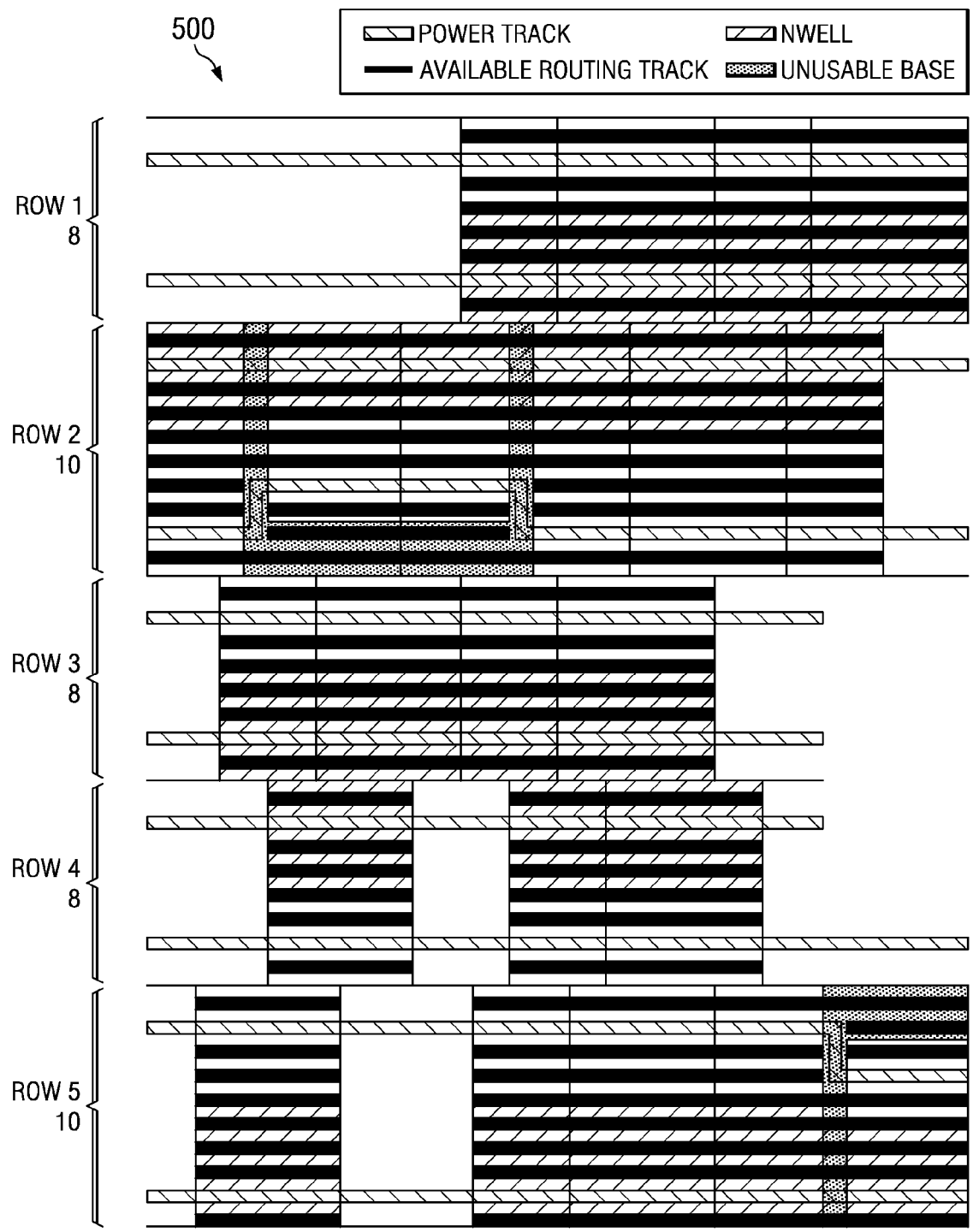

FIGS. 4 and 5 illustrate lay out diagrams of a third and fourth embodiment of logic blocks constructed according to the invention. In FIGS. 4 and 5, Rows 1, 3 and 4 have a track height of eight and Rows 2 and 5 have a track height of 10. Each cell in Rows 1, 3 and 4 has a cell height of eight that is equivalent to the track height. Rows 2 and 5 include cells of different height. In addition to cells having a cell height of ten, Row 2 includes two cells having a cell height of eight. In Rows 1, 3 and 4, the power rails are in alignment. In Rows 2 and 5, however, the power rails of the eight track cells are not aligned with the power rails of the ten-track cells. As such, vertical tracks are used to connect the power rails of the eight track cells with the power rails of the ten-track cells. In Row 2, the ground track $V_{SS}$ of the 10 track cells is connected in parallel to the ground track $V_{SS}$ of the 8 track cells via two vertical tracks. In Row 5, the power track $V_{DD}$ of the 10 track and 8 track cells are connected in parallel by vertical tracks.

In FIG. 5, vertical tracks are also used to connect the power rails of the 8 track and the 10 track cell. The power rails, however, are not connected in parallel. Accordingly, another horizontal track is available for signaling.

Figure 6:
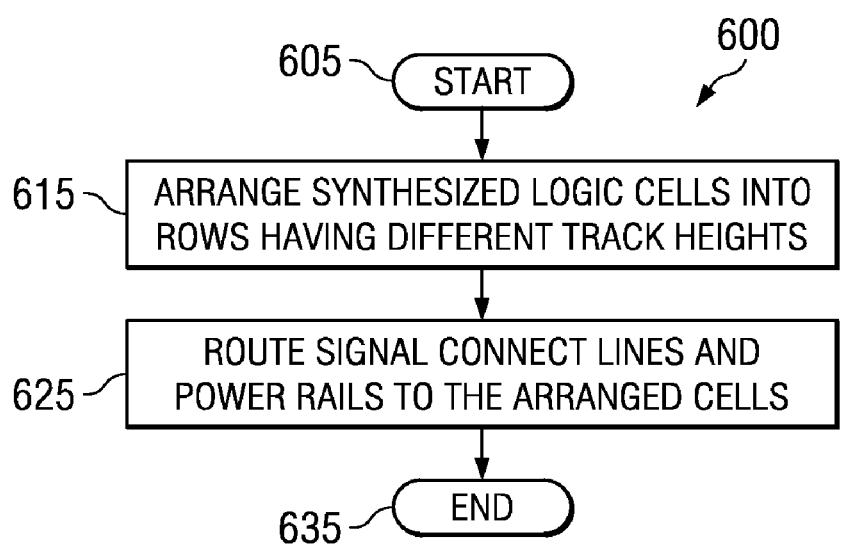
FIG. 6 illustrates a flow diagram of an embodiment of a method carried out according to the principles of the invention.

FIG. 6 illustrates a flow diagram of an embodiment of a method 600 of designing a logic block carried out according to the principles of the invention. The method may be implemented on a computer. The method 600 may be implemented as a series of operating instructions, i.e., software, used to direct the operation of a general purpose computer. The method 600 may also be implemented using dedicated hardware. The method 600 begins with the intent to design a logic block in a step 605.

After starting, synthesized logic cells are arranged into rows having different track heights in a step 615. The synthesized logic cells are selected from a cell library that includes cells of multiple cell heights. In some embodiments, cells of different cell heights are placed in at least one of the rows.

The track heights of each row and the cell heights are selected based on optimizing design requirements, such as power and speed, for the logic block. Power requirements are associated with the substrate area required by a cell, i.e., footprint. Less area results in less power due to a reduction in capacitance. Accordingly, an eight track cell has a smaller footprint and requires less power than a ten-track cell. A ten-track cell, however, provides higher performance than an eight track cell because a larger track cell operates at a higher speed. Accordingly, a mixture of cell heights and track heights are used to optimize the operation of the logic block. Mixing the cell heights and the track heights also allows flexibility for the designer. For example, a designer can begin with ten-track rows and incorporate eight track or seven track cells thereon at a later date if there is a design change.

After arranging the cells, signal connect lines and power rails are routed to the arranged cells in a step 625. The signal connect lines provide the proper interconnection between the arranged cells to achieve the desired functionality of the logic block. The power rails provide the needed power to each arranged cell. After routing, the method 600 ends in a step 635.

Those skilled in the art to which the invention relates will appreciate that other and further additions, deletions, substitutions and modifications may be made to the described embodiments without departing from the scope of the invention.

What is claimed is:

1. A logic block, comprising:
    a first row of standard cells having a first track height; and
    as second row of standard cells adjacent to said first row and having a second track height that differs from said first track height,
    wherein at least one of the first row and second row includes standard cells of multiple cell heights.

2. The logic block as recited in claim 1 wherein said first row of standard cells includes at least one standard cell having a cell height that is less than said first track height.

3. The logic block as recited in claim 1 wherein said first and second track heights are selected based on requirements for said logic block selected from the group consisting of:
    operational speed,
    power, and
    area.

4. The logic block as recited in claim 1 wherein said first row includes standard cells of at least three different cell heights.

5. The logic block as recited in claim 4 wherein said first track height is ten and said at least three different cell heights are seven, eight and ten.

6. A cell library for constructing logic blocks, comprising:
    a first group of standard cells having a first cell height for placement in a first logic block; and
    a second group of standard cells having a second cell height less than said first cell height, wherein each standard cell of said second group is designed to be placed within the first logic block in a logic block row having a track height substantially equivalent to said first cell height,
    wherein at least one of the first group and die second group includes standard cells of multiple cell heights.

7. The cell library as recited in claim 6 wherein at least one standard cell of said second group has power rails that align with power rails of said first group of standard cells when placed in a row having a track height of said first cell height.

8. The cell library as recited in claim 6 wherein at least one standard cell of said second group employs vertical tracks of said logic block to contact power rails of said first group of standard cells when placed in a row haying a track height of said first cell height.

9. The cell library as recited in claim 6 further comprising a third group of standard cells having a cell height less than said second cell height, wherein each standard cell of said third group is designed to be placed in a logic block row having a track height substantially equivalent to said first cell height.

10. The cell library as recited in claim 9 wherein said first cell height, said second cell height and said third cell height are each greater than or equal to seven.

11. A computer-implemented method of designing a logic block comprising arranging synthesized standard cells into rows of different track height within the same logic block, wherein the synthesized standard cells includes standard, cells of multiple cell heights.

12. The method of designing a logic block as recited in claim 11 wherein said synthesized standard cells have different cell heights, further comprising placing said synthesized standard cells of different cell heights into at least one of said rows.

13. The method of designing a logic block as recited in claim 12 further comprising routing signal connect lines and power lines to said synthesized standard cells.

14. The method of designing a logic block as recited in claim 13 wherein said arranging, said placing and said routing are based on optimizing performance, area and power requirements of said logic block.

15. An Application Specific Integrated Circuit (ASIC) comprising:
    a logic block, including:
        a row of standard cells having a first track height and including at least one first standard cell with a first cell height substantially equivalent to said first track height and at least one second standard cell with a second cell height less than said first cell height, wherein power rails for said first and said second standard cell are aligned when placed in said row.

16. The ASIC as recited in claim 15 wherein said row includes at least one third standard cell with a third cell height, said third standard cell having power rails that align with said power rails of said first and said second standard cells when said third standard cell is placed in said row.

17. The ASIC as recited in claim 15 further comprising a second row having a second track height.

18. The ASIC as recited in claim 17 further comprising a third row having a third track height.

* * * * *